United States Patent [19]

Tang et al.

[11] 4,125,414

[45] Nov. 14, 1978

[54] ORGANIC PHOTOVOLTAIC ELEMENTS

[75] Inventors: Ching W. Tang, Rochester; Alfred P. Marchetti, Penfield; Ralph H. Young, Rochester, all of N.Y.

[73] Assignee: Eastman Kodak Company, Rochester, N.Y.

[21] Appl. No.: 885,926

[22] Filed: Mar. 13, 1978

Related U.S. Application Data

[63] Continuation-in-part of Ser. No. 821,117, Aug. 2, 1977, abandoned.

[51] Int. Cl.² .............................................. H01L 31/04
[52] U.S. Cl. .................................. 136/89 NB; 357/8; 357/30; 250/211 J; 250/212
[58] Field of Search ................. 136/89 NB; 357/8, 30; 250/211 J, 212; 252/501

[56] References Cited

U.S. PATENT DOCUMENTS

| | | | |
|---|---|---|---|
| 2,999,750 | 9/1961 | Miller et al. ................................. | 96/1 |
| 3,009,006 | 11/1961 | Kostelec ................................. | 136/89 |
| 3,038,874 | 6/1962 | Laakso et al. ........................... | 260/42 |
| 3,057,947 | 10/1962 | Calvin et al. ........................... | 136/89 |
| 3,106,544 | 10/1963 | Laakso et al. ........................... | 260/47 |
| 3,106,545 | 10/1963 | Laakso et al. ........................... | 260/47 |
| 3,106,546 | 10/1963 | Laakso et al. ........................... | 260/47 |
| 3,250,615 | 5/1966 | Van Allan et al. ..................... | 96/1 |
| 3,507,706 | 4/1970 | Webb ....................................... | 136/89 |
| 3,530,007 | 9/1970 | Golubovic .............................. | 136/89 |
| 3,615,414 | 10/1971 | Light ....................................... | 96/1.6 |
| 3,615,415 | 10/1971 | Gramza ................................... | 96/1.6 |
| 3,679,407 | 7/1972 | Stephens ................................. | 96/1.6 |
| 3,706,554 | 12/1972 | Fox et al. ............................... | 96/1.6 |
| 3,732,180 | 5/1973 | Gramza et al. ........................ | 260/33.6 R |
| 3,789,216 | 1/1974 | Komp ...................................... | 250/211 R |
| 3,844,843 | 10/1974 | Kay et al. ............................... | 136/89 X |
| 3,873,312 | 3/1975 | Contois et al. ......................... | 96/1.6 |
| 3,938,994 | 2/1976 | Reynolds et al. ...................... | 96/1.6 |

OTHER PUBLICATIONS

R. L. Gamblin, "Solar Cell Utilizing Organic Photoconductor", *IBM Tech. Disc. Bull.*, vol. 18, p. 2442 (1976).

L. W. Davies, "Prospects for the Direct Conversion of Solar Energy to Electricity", *AWA Tech. Rev.*, vol. 15, pp. 139–142 (1974).

T. K. Mukherjee, "Photocurrents and Photopotentials in Organic Solids", *Conf. Record, IEEE Photospecialists Conf.* (1967), pp. 7–21.

*Primary Examiner*—John H. Mack
*Assistant Examiner*—Aaron Weisstuch
*Attorney, Agent, or Firm*—Dana M. Schmidt

[57] ABSTRACT

A photovoltaic element featuring a photoconductive composition comprising an electrically insulating binder, an organic dye, and an organic photoconductor is disclosed. The photovoltaic element has superior conversion efficiencies compared to other organic photovoltaic elements.

11 Claims, No Drawings

ORGANIC PHOTOVOLTAIC ELEMENTS

RELATED APPLICATIONS

This application is a continuation-in-part application of U.S. Ser. No. 821,117 filed on Aug. 2, 1977, now abandoned.

BACKGROUND OF THE INVENTION (1) Field of the Invention

This invention relates to photovoltaic elements useful for converting light and particularly for converting solar energy into electrical energy. The invention features the use of organic photoconductive materials.

(2) State of the Prior Art

Chief among materials used in the past for solar cells have been inorganic semiconductors, due to their fairly high conversion efficiencies which have been as high as 12 to 15%, for example, for silicon. However, such devices have proven to be very expensive to construct due to the melt and other processing techniques necessary to fabricate the semiconductor layer. As a result, such devices have had extensive practical utility only in the field of space exploration, and not in terrestrial applications.

In an effort to reduce the cost of solar cells, organic photoconductors and semiconductors have been considered, due to their inexpensive formation by solvent coating and similar techniques. However, prior-art organic materials have generally produced solar cells with conversion efficiencies only as high as about 0.05% at their highest, when exposed by incident sunlight at an intensity of 100 mw/cm$^2$. An example of such a material is crystal violet, as described, for example, in U.S. Pat. No. 3,844,843. Still higher efficiencies are desirable if the cells are to have practical terrestrial use, notwithstanding their inexpensive cost of manufacture. An efficiency of 0.3% was reported as being achieved through the use of an undisclosed dopant, as noted in "Prospects for Direct Conversion of Solar Energy to Electricity," *AWA Technical Review*, Vol. 15, No. 4, 1974, reference 3, but none of the materials used has been disclosed.

Solar cells utilizing other organic photoconductive materials are disclosed in U.S. Pat. Nos. 3,009,006; 3,057,947; 3,507,706 and 3,530,007 and *IBM Technical Disclosure Bulletin* 18 (8), No. 2442 (January, 1976). However, there is no disclosure in any of these publications that the resultant solar cells exhibit a conversion efficiency high enough for extensive practical terrestrial use, i.e., greater than about 0.05%.

Photoconductive materials containing pyrylium-type dyes have been used in electrophotographic copiers. For example, U.S. Pat. Nos. 3,250,615 issued May 10, 1966, and 3,938,994 issued Feb. 17, 1976, describe pyrylium-type dyes useful in photoconductive compositions. Particularly useful pyrylium-type dye-containing photoconductive compositions are the so-called multiphase heterogeneous or "aggregate"-containing photoconductive compositions described in U.S. Pat. Nos. 3,615,414 and 3,615,415 both issued Oct. 26, 1971; 3,679,407 issued July 25, 1972; 3,706,554 issued Dec. 19, 1972; 3,732,180 issued May 8, 1973; and 3,873,312 issued Mar. 25, 1975. Certain photoconductors other than those multiphase heterogeneous compositions noted above have been successfully used in some instances in solar cells. However, U.S. Pat. No. 3,507,706 notes that it is well-known that, although certain photoconductors such as a charge-transfer photoconductor material are useful in electrophotography, this does not mean these same materials necessarily possess a utility in photovoltaic elements. This is demonstrated in part by the different physical and electrical properties of the photoconductive materials when used in the two different environments. Therefore, it cannot be ascertained with any degree of certainty whether a photoconductive composition useful in electrophotography will be useful in fabricating a solar cell and, if useful, whether any improvement in conversion efficiency can be obtained.

Aggregate photoconductors have been sandwiched between an electrode on one side and a charge-sensitive silver behenate layer on the other side to create an electrosensitive recording element as described, for example, in U.S. application Ser. No. 850,105 filed on Nov. 9, 1977, a continuation application of Ser. No. 731,861 filed on Oct. 12, 1976 by Light, entitled *Electrophotothermographic Elements*, now abandoned. However, the silver behenate layer is not an electrical conductor and the sandwich does not function as an effective solar cell.

OBJECTS OF THE INVENTION

It is an object of the invention to provide a photovoltaic element with an organic photoconductive composition which enhances the element's conversion efficiency to levels that in many cases exceed those possible in prior organic elements.

It is a related object to provide such a photovoltaic element which combines the low cost of organic compositions with higher conversion efficiencies.

Other objects and advantages will become apparent upon reference to the following summary and description of preferred embodiments.

SUMMARY OF THE INVENTION

The invention concerns a photovoltaic element having enhanced electrical response to incident light because of the use of certain organic photoconductive compositions.

More specifically, there is provided a photovoltaic element, comprising:
- a layer of a photoconductive composition having opposed surfaces, such composition comprising an electrically insulating binder, a pyrylium-type dye salt and an organic photoconductor;
- and an electrical conductor adjacent each of said layer surfaces;
- said element having a conversion efficiency when exposed to sunlight of at least about 0.05 percent.

DESCRIPTION OF THE PREFERRED EMBODIMENTS

Although the invention is hereinafter described particularly with respect to solar cells as the preferred embodiment, it is not limited thereto. Rather, it applies to all photovoltaic elements using photoconductors of the type hereinafter described. As used herein, "photovoltaic element" or "solar cell" means a solid-state device which converts radiation absorbed by the element directly to electric power. Thus, the element of this invention is suitable as a terrestrial rooftop generator or as a light-level measuring device. As a light-level measuring device, the cell can be used both at high and low light levels. The cell exhibits a moderately high open-circuit voltage, even in diffuse roomlight conditions.

Alternatively, the cell can also be used in the current mode. The current generated in a diffuse roomlight following polycarbonates are illustrative of those that can be used:

TABLE I

| Number | Polymeric Material |
|---|---|
| 1 | Poly(4,4'-isopropylidenediphenylene-co-1,4-cyclohexyldimethylene carbonate). |
| 2 | Poly(3,3'-ethylenedioxyphenylene thiocarbonate). |
| 3 | Poly(4,4'-isopropylidenediphenylene carbonate-co-terephthalate). |
| 4 | Poly(4,4'-isopropylidenediphenylene carbonate). |
| 5 | Poly(4,4'-isopropylidenediphenylene thiocarbonate). |
| 6 | Poly[2,2-butanebis(4-phenylene) carbonate]. |
| 7 | Poly(4,4'-isopropylidenediphenylene carbonate-block-ethylene oxide). |
| 8 | Poly(4,4'-isopropylidenediphenylene carbonate-block-tetramethyleneoxide). |
| 9 | Poly[4,4'-isopropylidenebis(2-methylphenylene) carbonate]. |
| 10 | Poly(4,4'-isopropylidenediphenylene-co-1,4-phenylene carbonate). |
| 11 | Poly(4,4'-isopropylidenediphenylene-co-1,3-phenylene carbonate). |
| 12 | Poly(4,4'-isopropylidenediphenylene-co-4,4'-biphenylidene carbonate). |
| 13 | Poly(4,4'-isopropylidenediphenylene-co-4,4'-oxydiphenylene carbonate). |
| 14 | Poly(4,4'-isopropylidenediphenylene-co-4,4'-carbonyldiphenylene carbonate). |
| 15 | Poly(4,4'-isopropylidenediphenylene-co-4,4'-ethylenediphenylene carbonate). |
| 16 | Poly[4,4'-methylenebis(2-methylphenylene)carbonate]. |
| 17 | Poly[1,1-(p-bromophenylethane)bis(1,4-phenylene) carbonate]. |
| 18 | Poly[4,4'-isopropylidenediphenylene-co-sulfonylbis(4-phenylene) carbonate]. |
| 19 | Poly[1,1-cyclohexanebis(1,4-phenylene) carbonate |
| 20 | Poly[4,4'-isopropylidenebis(2-chlorophenylene) carbonate]. |
| 21 | Poly(hexafluoroisopropylidene di-1,4-phenylene carbonate). |
| 22 | Poly[4,4'-(3-methyl-2-butylidene)bisphenylene carbonate]. |
| 23 | Poly[4,4'-(3,3-dimethyl-2-butylidene)bisphenylene carbonate]. |
| 24 | Poly[4,4'-(naphthylidene)diphenylene carbonate]. |
| 25 | Poly[4,4'-(4-methyl-2-pentylidene)bisphenylene carbonate]. |
| 26 | Poly[4,4'-(2-norbortnylidene)diphenylene carbonate]. |
| 27 | Poly[4,4'-(hexahydro-4,7-methanoindan-5-ylidene)diphenylene carbonate]. |
| 28 | Poly(4,4'-isopropylidenediphenylene carbonate-block-oxytetramethylene). |
| 29 | Poly[4,4'-(2-norbornylidene)bis(2,6-dichlorophenylene) carbonate]. | condition is about 20 $\mu A/cm^2$, a large enough current to be measured accurately. The current can thus become a measure of the light intensity, and the calibrated cell can be used as an exposure meter and find application in cameras.

The photoconductive composition of the cell comprises an electrically insulating binder, a pyrylium-type dye salt and an organic photoconductor. Prior to, during, or after coating this composition, it is preferably processed in such a way as to obtain, at least in some instances, "aggregate" formation, i.e., the presence in the photoconductive composition of a discrete discontinuous phase composed of a particulate co-crystalline complex of the binder and dye dispersed in a continuous phase of the binder and photoconductor. Such processing is hereinafter termed "aggregate processing."

A wide range of film-forming resins is useful for the binders. For example, in the case of many of the class (I) dyes hereinafter described, a wide variety of binders can be used ranging from polystyrene to polycarbonates such as those described more fully hereinafter. Highly useful for one class of dyes, shown as structure (II) hereafter described, are polymers containing an alkylidene diarylene moiety in the recurring unit such as those prepared with Bisphenol A and including polymeric products of ester exchange between diphenylcarbonate and 2,2-bis-(4-hydroxyphenyl)propane. Such compositions are disclosed in the following U.S. Patents: U.S. Pat. Nos. 2,999,750 by Miller et al, issued Sept. 12, 1961; 3,038,874 by Laakso et al, issued June 12, 1962; 3,106,544 by Laakso et al, issued Oct. 8, 1963; 3,106,545 by Laakso et al, issued Oct. 8, 1963; and 3,106,546 by Laasko et al issued Oct. 8, 1963. Many film-forming polycarbonate resins are useful, with completely satisfactory results being obtained when using commercial polymeric materials which are characterized by an inherent viscosity of between about 0.5 and about 3.0. If spin-coating of the composition is desired in the manufacture, then the higher-molecular-weight polycarbonates are preferred, such as Bisphenol A polycarbonates with inherent viscosities of 1.5 to 3.0. The In addition to the aforesaid polycarbonate binders, a variety of other binders can be used, particularly with the class I dyes described below. Examples of such other binders are poly[4,4'-(hexahydro-4,7-methanoindan-5-ylidene)diphenylene terephthalate], poly[4,4'-(isopropylidene)diphenylene-4,4'-oxydibenzoate, and polystyrene].

Pyrylium-type dye salts are useful as the dye portion of the composition. Included are pyrylium, thiapyrylium and selenapyrylium dye salts, and also salts of the aforementioned pyrylium-type compounds containing condensed ring systems such as salts of benzopyrylium and naphthopyrylium dyes.

Of the above-described pyrylium-type dye salts, a useful group includes those having the structure:

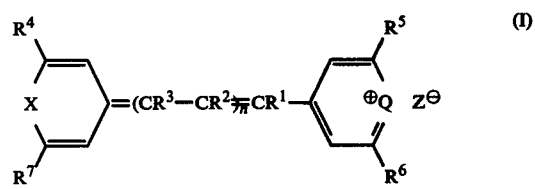

wherein $R^1$, $R^2$ and $R^3$ are the same or different and are each hydrogen; alkyl containing from 1 to about 6 carbon atoms such as methyl, ethyl, propyl, isopropyl and the like; aryl such as phenyl; cyano or nitro;

X and Q are the same or different and are each selected from the group consisting of O, S or Se;

n is 1 or 0;

$R^4$, $R^5$, $R^6$ and $R^7$ are the same or different and are each phenyl, here used to include substituted phenyl, or alkyl or alkoxy containing from 1 to about 5 carbon atoms, such as methyl, ethyl, isopropyl, methoxy, propoxy and the like, at least two of $R^4$, $R^5$, $R^6$ and $R^7$ being phenyl; and $Z^\ominus$ is an anionic moiety such as perchlorate, fluoroborate, sulfate and the like. If $R^4$, $R^5$, $R^6$ or $R^7$ are substituted phenyl, it is preferred that the substituents be located in the para position and be selected from among those which shift the blue absorption peak of the dye to a longer wavelength. Useful examples of such substituents include alkyl from 1 to 3 carbon atoms, and halogen such as chlorine, fluorine and the like.

Useful examples of dyes within structure (I) include those described in commonly-owned U.S. Application Ser. No. 813,371 filed on July 6, 1977 by M. Petropoulos et al, entitled "Novel Radiation Sensitive Compounds and Radiation Sensitive Compositions Containing the Same."

Highly useful and currently preferred examples of dye salts within structure (I) are those having the structure

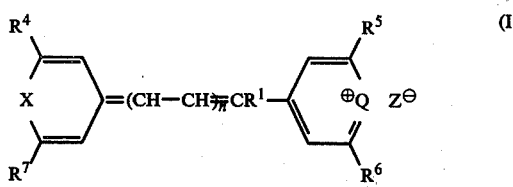

(I')

wherein $R^1$ is hydrogen, aryl, alkyl containing from 1 to about 6 carbon atoms, cyano or nitro;

X and Q are either S, O; S, S; Se, O; or S, Se respectively, $n$ is 1 or 0;

and $R^4$, $R^5$, $R^6$, $R^7$ and $Z^\ominus$ are as described above for generic structure (I).

Although some dye salts of structure (I) do not form visually observable "aggregate" particles of dye salt and binder as described above when processed as described hereinafter, such as compounds 39 and 40 of Table II, such dyes are processed as though such aggregation does occur. That is, the steps for aggregate formation or phase separation are followed here as in the case of the other dye salts. It is believed that when these dyes are so processed, for example by fuming with the solvent, the dyes themselves undergo a dye-dye interaction (rather than a dye-polymer cocrystallization) and such dyes exhibit an absorption spectrum that is changed when a binderless coating of such dyes is so processed.

It is contemplated that another subclass of useful pyrylium-type dyes is 2,4,6-trisubstituted pyrylium and thiapyrylium dye salts of the general structure:

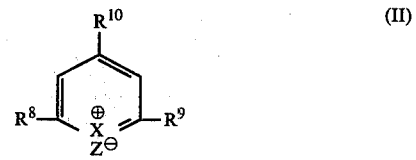

(II)

in which $R^8$, $R^9$ and $R^{10}$ are each alkyl from 1 to about 6 carbon atoms, such as methyl, ethyl, isopropyl and the like; phenyl, here used to include substituted phenyl; thienyl; furyl; pyridyl; pyrimidinyl; thiadiazolyl or thiazolyl or pyrrolyl; with the proviso that at least one of $R^8$, $R^9$, and $R^{10}$ is different from the other two and represents an alkylamino-substituted phenyl or an alkylamino-substituted 5- or 6-membered heterocyclic ring having from 1–6 carbon atoms in the alkyl moiety, including dialkylamino-substituted and halogenated alkylamino-substituted phenyl radicals, dialkylaminopyridyl, dialkylaminofuryl, dialkylaminothienyl, dialkylaminothiazolyl; X is oxygen, selenium or sulfur; and $Z^\ominus$ is an anion, such as perchlorate, fluoroborate and the like. Examples of such compounds, particularly wherein at least one of $R^8$, $R^9$ and $R^{10}$ is heterocyclic, are described and claimed in commonly owned U.S. application Ser. No. 711,046 filed Aug. 2, 1976, by Specht et al, entitled "Sensitizers for Photoconductive Compositions," and in *Research Disclosure*, Vol. 157, May 1977, Publication No. 15742, published by Industrial Opportunities Limited, Homewell, Havant Hampshire PO91EF United Kingdom, the details of which are expressly incorporated herein by reference.

This subclass of dyes (II) includes dyes that do undergo a dye-polymer interaction to produce a discernable discrete discontinuous phase composed of the aforementioned particulate co-crystalline complex of dye and binder dispersed within the continuous phase of binder-photoconductor when aggregate-processed.

Representative useful dye salts falling within structures (I) and (II) above can be found in Light U.S. Pat. No. 3,615,414, and include those in the following Table II:

TABLE II

| Compound Number | Name of Compound |
|---|---|
| 1 | 4-{4-[bis(2-chloroethyl)amino]phenyl}-2,6-diphenylthiapyrylium perchlorate |
| 2 | 4-(4-dimethylaminophenyl)-2,6-diphenylthiapyrylium perchlorate |
| 3 | 4-(4-dimethylaminophenyl)-2,6-diphenylthiapyrylium fluoroborate |
| 4 | 4-{4-[bis(2-chloroethyl)amino]-phenyl}-2-(4-methoxyphenyl)-6-phenylthiapyrylium perchlorate |
| 5 | 4-(4-dimethylaminophenyl)-2,6-diphenylthiapyrylium sulfate |
| 6 | 4-(4-dimethylaminophenyl)-2,6-diphenylthiapyrylium p-toluenesulfonate |
| 7 | 2,6-bis(4-ethylphenyl)-4-(4-dimethylaminophenyl)thiapyrylium perchlorate |
| 8 | 4-(4-dimethylaminophenyl)-2-(4-methoxyphenyl)-6-phenylthiapyrylium perchlorate |
| 9 | 4-(4-dimethylaminophenyl)-2-(4-ethoxyphenyl)-6-phenylthiapyrylium perchlorate |
| 10 | 4-(4-diphenylaminophenyl)-2,6-diphenylthiapyrylium perchlorate |
| 11 | 2,6-bis(4-ethylphenyl)-4-(4-methoxyphenyl)thiapyrylium fluorobroate |
| 12 | 2,4,6-triphenylthiapyrylium perchlorate |
| 13 | 4-(4-methoxyphenyl)-2,6-diphenylthiapyrylium perchlorate |
| 14 | 6-(4-methoxyphenyl)-2,4-diphenylthiapyrylium perchlorate |
| 15 | 2,6-bis(4-methoxyphenyl)-4-phenylthiapyrylium perchlorate |
| 16 | 4-(2,4-dichlorophenyl)-2,6-diphenylthiapyrylium perchlorate |
| 17 | 2,4,6-tris(4-methoxyphenyl)thiapyrylium perchlorate |
| 18 | 2,6-bis(4-ethylphenyl)-4-phenylthiapyrylium perchlorate |
| 19 | 4-(4-amyloxyphenyl)-2,6-bis(4-ethylphenyl)thiapyrylium perchlorate |
| 20 | 6-(4-dimethylaminostyryl)-2,4-diphenylthiapyrylium perchlorate |
| 21 | 2,4,6-triphenylthiapyrylium fluoroborate |
| 22 | 2,4,6-triphenylthiapyrylium sulfate |
| 23 | 4-(4-methoxyphenyl)-2,6-diphenylthiapyrylium fluoroborate |
| 24 | 2,4,6-triphenylthiapyrylium chloride |
| 25 | 2-(4-amyloxyphenyl)-4,6-diphenylthiapyrylium fluoroborate |
| 26 | 4-(4-amyloxyphenyl)-2,6-bis(4-methoxyphenyl)thiapyrylium perchlorate |
| 27 | 2,6-bis(4-ethylphenyl)-4-(4-methoxyphenyl)thiapyrylium perchlorate |

TABLE II-continued

| Compound Number | Name of Compound |
|---|---|
| 28 | 4-anisyl-2,6-bis(4-n-amyloxyphenyl)thiapyrylium chloride |
| 29 | 2-[β,β-bis(4-dimethylaminophenyl)vinyl]-4,6-diphenylthiapyrylium perchlorate |
| 30 | 6-(β-ethyl-4-dimethylaminostyryl)-2,4-diphenylthiapyrylium perchlorate |
| 31 | 2-(3,4-diethoxystyryl)-4,6-diphenylthiapyrylium perchlorate |
| 32 | 2,4,6-trianisylthiapyrylium perchlorate |
| 33 | 2,6-bis(4-ethylphenyl)-4-(4-methoxyphenyl)thiapyrylium perchlorate |
| 34 | 2,6-bis(4-amyloxyphenyl)-4-(4-methoxyphenyl)thiapyrylium perchlorate |
| 35 | 2,6-diphenyl-4-(4-methoxyphenyl)thiapyrylium perchlorate |
| 36 | 2,6-diphenyl-4-(4-methoxyphenyl)thiapyrylium fluoroborate |
| 37 | 2,6-bis(4-ethylphenyl)-4-(4-m-amyloxyphenyl)thiapyrylium perchlorate |
| 38 | 2,6-bis(4-methoxyphenyl)-4-(4-n-amyloxyphenyl)thiapyrylium perchlorate |
| 39 | 4-[(2,6-diphenyl-4H-thiapyran-4-ylidene)methyl]-2,6-diphenylthiapyrylium perchlorate |
| 40 | 4-[(2,6-diphenyl-4H-thiapyran-4-ylidene)methyl]-2,6-diphenylselenapyrylium perchlorate |
| 41 | 4-[(2,6-diphenyl-4H-thiapyran-4-ylidene)methyl]-2,6-diphenylpyrylium fluoroborate |
| 42 | 4-[(2,6-diphenyl-4H-selenin-4-ylidene)methyl]-2,6-diphenylpyrylium fluoroborate |

Unsymmetrical selenapyrylium dyes can be prepared as follows. In structures IV and V, Q represents O or S.

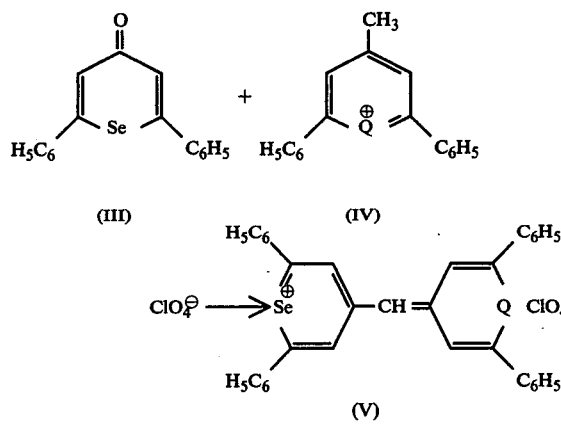

A mixture of 0.31 g of (III) and 0.35 g of (IV) in 10 ml of acetic anhydride can be refluxed for 30 minutes and cooled to room temperature during which time glistening needles of the desired dye material can be formed.

A wide range of organic photoconductors can be used. Preferred are organic amines such as triphenyl and tolyl amines as well as amine-substituted stilbenes and styrylstilbenes, and polyarylalkanes represented by the formula:

wherein each of D, E and G is an aryl group and J is a hydrogen atom, an alkyl group or an aryl group, with at least one of D, E and G containing an amino substituent. The aryl groups attached to the central carbon atom are preferably phenyl groups, although naphthyl groups can also be used. Such aryl groups can contain such substituents as alkyl and alkoxy typically having 1-8 carbon atoms, hydroxy, halogen, etc., in the ortho, meta or para positions, ortho-substituted phenyl being preferred.

Representative useful photoconductors include the compounds listed in Table III.

TABLE III

| Compound No. | Name of Compound |
|---|---|
| 1 | 4,4'-benzylidenebis(N,N-diethyl-m-toluidine) |
| 2 | 4',4''-diamino-4-dimethylamino-2',2''-dimethyltriphenylmethane |
| 3 | 4',4''-bis(diethylamino)-2,6-dichloro-2',2''-dimethyltriphenylmethane |
| 4 | 4',4''-bis(diethylamino)-2',2''-dimethyldiphenylnaphthylmethane |
| 5 | 2',2''-dimethyl-4,4'4''-tris(dimethylamino)triphenylmethane |
| 6 | 4',4''-bis(diethylamino)-4-dimethylamino-2',2''-dimethyltriphenylmethane |
| 7 | 4',4''-bis(diethylamino)-2-chloro-2',2''-dimethyl-4-dimethylaminotriphenylmethane |
| 8 | 4',4''-bis(diethylamino)-4-dimethylamino-2,2',2''-trimethyltriphenylmethane |
| 9 | 4',4''-bis(dimethylamino)-2-chloro-2',2''-dimethyltriphenylmethane |
| 10 | 4',4''-bis(dimethylamino)-2',2''-dimethyl-4-methoxytriphenylmethane |
| 11 | bis(4-diethylamino)-1,1,1-triphenylethane |
| 12 | bis(4-diethylamino)tetraphenylmethane |
| 13 | 4',4''-bis(benzylethylamino)-2',2''-dimethyltriphenylmethane |
| 14 | 4',4''-bis(diethylamino)-2',2''-diethoxytriphenylmethane |
| 15 | 4,4'-bis(dimethylamino)-1,1,1-triphenylethane |
| 16 | 1-(4-N,N-dimethylaminophenyl)-1,1-diphenylethane |
| 17 | 4-dimethylaminotetraphenylmethane |
| 18 | 4-diethylaminotetraphenylmethane |
| 19 | 4-di-p-tolylamino-4'-[4-(di-p-tolylamino)styryl]stilbene |
| 20 | 4-di-p-diethylaminophenylamino-4'-[4-di-(p-diethylaminophenylamino)styryl]stilbene |
| 21 | tri-p-tolylamine |
| 22 | 1,1-bis(4-di-p-tolylaminophenyl)cyclohexane |

It will be appreciated that almost all of the photoconductors of Table III are hole conductors or P-type by themselves. However, when used in the composition including the dye, certain of these photoconductors give to the entire composition P-type characteristics while others give N-type characteristics.

In the case of N-type photoconductive compositions, the efficiency can be further increased by adding an optional amount of a dopant capable of increasing the conductivity of the photoconductor. Particularly useful examples of such dopants include halogens, such as iodine, bromine, chlorine and the like, quinone, substituted quinones, anthraquinones, substituted anthraquinones and the like.

The dry thickness of the photoconductive composition is an important aspect of the invention, at least if maximum conversion efficiencies are desired. It has been found that efficiencies begin to decrease drastically for thicknesses in excess of about 0.5 micron, possibly due to increased carrier path length. Maximum thicknesses appear to be dictated more by coating techniques and the minimum that can be used without shorting. Useful devices of improved efficiency have been constructed with thicknesses as low as about 500 A.

The electrodes for the cell are selected from materials, usually metals or degenerate semiconductors, that are electrical conductors. Whether or not one or more of the electrodes forms a rectifying junction with the photoconductive composition is not believed to be important, so long as conversion efficiencies remain at least at about 0.05%. In practice, it is unusual to have an element with such efficiencies that does not have at least a weak rectification, and it has been found that the higher efficiencies, and therefore the preferred construction, arise when the materials of the electrodes are selected with relative work functions that are sufficient to create significant rectification within the element for a given photoconductive composition. As used herein, "significant rectification" means the flow of current through the element in one direction which is greater than in the other direction, in a ratio which is at least about 5 to 1.

Elements having the highest conversion efficiencies, e.g., about 0.2 to about 0.3%, are those in which the electrodes have the greatest difference in work functions. That is, from the materials set forth in Table IV below two are selected to give a wide disparity in the work functions.

Table IV

| Electrode Materials and Work Functions | |
|---|---|
| indium | 3.80 |
| aluminum | 4.25 |
| silver | 4.30 |
| tin | 4.40 |
| copper | 4.40 |
| nickel | 4.50 |
| chromium | 4.60 |
| gold | 4.80 |
| Nesa® or Nesatron® glass* | >4.8 |

*a semitransparent electrode material comprising conductive indium tin oxide layer coated onto transparent glass, manufactured by PPG Industries, Inc., having a sheet resistance of about 10 to about 50 ohm/square and an optical transmittance of about 80%, for visiable light. (An equivalent material is a thin semitransparent layer of nickel vacuum deposited on poly(ethylene terephthalate) film.)

Highly preferred from the above table are indium and Nesatron glass, in view of their greatest disparity in work functions. Furthermore, Nesatron glass and the equivalent nickel-coated polyester film, have the advantage of semitransparency, so as to provide a suitable exposure surface for the cell. Therefore, Nesatron and Nesa materials constitute a preferred material for the electrode through which the cell is to be illuminated, hereinafter identified as the "window" electrode. However, the other electrode materials can be utilized as the window electrode if the metal coating is thin enough to provide semitransparency.

It will be appreciated that a preferred construction of the cell is one in which the electrodes are not only adjacent to, but are also in physical contact with, each of the opposed surfaces of the photoconductive layer. However, this need not always be the case, because it has been found that further improvement can be achieved by optionally coating the window electrode with a nucleating agent comprising copper phthalocyanine prior to coating the photoconductive composition. In such a case, the finished cell has a very thin (about 50 A) layer of the nucleating agent separating the photoconductive layer from the adjacent window electrode. The nucleating agent appears to render more uniform, and possibly smaller, the size of the "aggregate" particles forming the discrete discontinuous phase, to the extent it forms at all, leading to a more uniform absorption of the light by the cell.

Convenient methods of preparation of the photoconductive composition include those used to make "aggregate"-containing electrophotographic photoconductors, such as mixing the composition in two solvents of different boiling points, so that differential evaporation rates occur upon drying, or exposing a dried coating of the composition to a solvent vapor. These and other processes are described in U.S. Pat. Nos. 3,615,414; 3,615,415; 3,679,407; and 3,706,554 and 3,732,180 the details of which are hereby expressly incorporated herein by reference.

It has been found that many of the compositions described above, when processed as described, demonstrate an altered absorption spectrum, e.g., a shift of an absorption peak, compared to the absorption spectrum of an identical composition which has not been subjected to such aggregate processing.

Useful methods of manufacturing the photoconductive layer include roll-coating and spin-coating techniques wherein a solution of the binder, dye and photoconductor in a 1:1 mixture of 1,1-dichloromethane and 1,2-dichloroethane is poured onto the conducting surface of a clean Nesatron® glass electrode while the latter is spun at about 1000 to 5000 rpm until a wet thickness is achieved which dries down to a thickness no greater than about 0.5 micron. Subsequently, a vapor treatment for about 1-5 minutes in an appropriate solvent vapor can be utilized to aggregate-process the dye and binder in the photoconductive composition. Useful solvents for the vapor treatment include toluene, xylene, chlorobenzene, 1,2-dichlorobenzene, bromobenzene, dichloromethane and 1,2-dichloroethane. The opposite electrode is then preferably applied by conventional vapor deposition. Such electrode can be coextensive with the contacting surface of the photoconductor, but it can also cover only a fraction of the surface.

The cleanliness of the Nesatron® glass can be achieved by any convenient polishing technique. A currently preferred polishing process comprises the steps of rubbing the Nesatron surface with a cotton flannel wetted with a suspension of an alumina or other abrasive, or by polishing in a spinning disc, usually for a few minutes. The polished Nesatron Surface is then sonicated in a 1:1 $H_2O$/isopropyl alcohol bath for about ½ hour to remove the abrasive particles, and then rinsed thoroughly with distilled water. The polished Nesatron® Surface appears relatively clear in a strong light.

The concentrations of the photoconductor solutions are preferably such as to provide approximately equal weight amounts of organic photoconductor and binder, with no more than 50% of total solids being the binder, and sufficient amounts of dye to produce an optical density up to about 1.0. Highly useful dye concentrations produce an optical density between about 0.3 and about 0.6. Representative amounts of dye to produce such optical densities range between 3 and about 40 weight percent of the total dried solids weight of the photoconductive layer, depending upon the extinction coefficient of the dye. The preferred range for the dyes of Table II is from about 5 to about 20 weight percent.

Total coverage in the photoconductive layer can range between about 0.2 mg./dm.$^2$ to about 20 mg./dm.$^2$, and preferably between about 0.5 mg./dm.$^2$ and about 4 mg./dm.$^2$ Preferred solvents for the solutions to be spin-coated include dichloromethane, 1,2-dichloroethane and 1:1 mixtures of these two.

Cells made in accordance with the preceding description can be illuminated by sunlight or by artificial light. In the case of the latter, and particularly in the case of light rich in UV, preferred usage interposes a filter excluding light of wavelengths less than about 500 nm., as UV light can cause premature degradation of the cell.

The following examples illustrate the practice of the invention.

EXAMPLE 1

An organic solar cell was fabricated as follows:

A coating solution 1.4% by weight of solids in a mixed solvent of 1,1-dichloromethane and 1,2-dichloroethane (in 1:1 weight ratio) was prepared by sequentially dissolving in 40 g. of the mixed solvent 112 mg. of a thiapyrylium dye salt 2,6-diphenyl-4-(4-dimethylaminophenyl)thiapyrylium hexafluorophosphate, 294 mg. of a high-molecular-weight Bisphenol A polycarbonate having an inherent viscosity of about 2.3 and 294 mg. of an organic photoconductor, 4-di-p-tolylamino-4'-[4-(di-p-tolylamino)styryl]stilbene.

A clean piece of Nesatron ® glass about 2.5 cm × 2.5 cm was spun on a turntable at about 2000 rpm. While spinning, a small quantity (about 0.5 ml.) of the coating solution was poured on the conducting surface of the Nesatron glass. A thin and apparently uniform film was obtained upon evaporation of the solvent. The thickness of the dry film was about 2000 A.

The spin-coated film was then subjected to vapor treatment by a toluene vapor to induce aggregation of the thiapyrylium dye and the Bisphenol A polycarbonate polymer. Vapor treatment for 2 min. was sufficient to induce essentially complete aggregation.

To complete the fabrication, an evaporated layer of indium having an area of 1 cm.$^2$ was applied on top of the aggregated coating.

The photovoltaic cell was illuminated through the semitransparent Nesatron electrode with a broad-band illumination of 100 mW/cm.$^2$ intensity provided by an unmodified Kodak 600H slide projector containing a tungsten light source and filtered through a Corning 3384 filter, which cuts off light of wavelength shorter than 500 nm. The open-circuit voltage developed between the Nesatron and the indium electrodes was 800 mV and the short-circuit current was 1.0 mA/cm.$^2$. The maximum power delivered to a resistive load of 1000 ohms was about 0.2 mV, representing a power conversion efficiency of 0.2%.

EXAMPLE 2

The cell described in Example 1 was illuminated through Nesatron glass with monochromatic light of wavelength 670 nm. and of intensity 0.66 mW/cm.$^2$, produced by intercepting the tungsten light of Example 1 with Balzers interference filters with bandwidths of about 10 nm. This illumination produced an open-circuit voltage of 740 mV and a short-circuit current of 62 μA/cm.$^2$. The power conversion efficiency under such monochromatic illumination was 2.5%. The collection efficiency, i.e., charge carriers produced per photon incident on the cell, was about 17%.

EXAMPLE 3

A photovoltaic cell was prepared as described in Example 1 except that the photoconductive element had the following formulation: 42% high-molecular-weight Bisphenol A polycarbonate polymer, 16% 2,6-diphenyl-4-(4-dimethylaminophenyl)thiapyrylium hexafluorophosphate and 42% tritolylamine. Under a broad-band illumination of intensity 100 mW/cm.$^2$ provided by an unmodified Kodak 600H slide projector, filtered through a Corning 3384 filter, the cell (with Nesatron glass and indium as electrodes) produced an open-circuit voltage of 800 mV, a short-circuit current of 240 μA/cm.$^2$ and a conversion efficiency of 0.05%.

EXAMPLE 4

A cell was prepared as described for Example 1, except that 16% by weight of the photoconductive composition was the dye 4-[(2,6-diphenyl-4H-thiapyran-4-ylidene)methyl]-2,6-diphenylthiapyrylium perchlorate. Such a cell yielded a simulated sunlight conversion efficiency of 0.13% with an open-circuit voltage of 520 mV, $I_{sc} = 0.85$ mA/cm.$^2$ and a fill factor of 0.3.

EXAMPLE 5

Preparation of the cell of Example 1 was repeated, except that prior to spin-coating the photoconductive composition, a coating of copper phthalocyanine (50–100 A) was first applied as a nucleating agent. The resultant photoconductive film was much more uniform with an aggregate particle size of about 0.3–0.4μ compared with the aggregate particle size of about 10μ for the film without the nucleating copper phthalocyanine layer. With such a two-layer system the cell yielded a conversion efficiency of 0.38% under a simulated sunlight of 75 mW/cm.$^2$ intensity.

EXAMPLE 6

A photovoltaic cell was prepared as decribed in Example 1, except that the photoconductive element had the following N-type formulation: 42% high-molecular-weight Bisphenol A polycarbonate polymer, 16% 2,6-diphenyl-4-(4-dimethylaminophenyl)thiapyrylium hexafluorophosphate, 42% 4,4'-benzylidene-bis(N,N-diethyl-m-toluidine). Under a broad-band illumination of 100 mW/cm.$^2$ intensity provided by an unmodified Kodak 600H slide projector and filtered through a Corning 3384 filter, the cell produced an open-circuit voltage of 500 mV, a short-circuit current of 60 μA/cm.$^2$ and a conversion efficiency of 0.007%.

However, when this example was repeated, except for the addition to the photoconductive element of a small amount of iodine, the conversion efficiency was markedly increased. The coating formulation was as follows: 41.5% high-molecular-weight Bisphenol A polycarbonate polymer, 16% 2,6-diphenyl-4-(4-dimethylaminophenyl)thiapyrylium hexafluorophosphate, 41.5% 4,4'-benzylidene-bis(N,N-diethyl-m-toluidine) and 1% iodine. Under a broad-band illumination of 100 mW/cm.$^2$ intensity provided by an unmodified Kodak 600H slide projector and filtered through a Corning 3384 filter, the cell (with Nesatron and indium as electrodes) produced an open-circuit voltage of 610 mV, a short-circuit current of 150 μA/cm.$^2$, and a power conversion efficiency of 0.023%. This represents an enhancement by a factor of 3 over the efficiency of the undoped cell as a result of the doping of the photoconductive element with iodine. Further enhancement to the level of 0.05% (simulated sunlight) can be expected by increasing the amount of dopant or by selecting a better dopant.

EXAMPLE 7

A photovoltaic cell was prepared as described in Example 1, but the photoconductive element had the following formulation, by weight:
42% high-molecular-weight Bisphenol A polycarbonate polymer
16% 4-[2,6-diphenyl-4H-thiapyran-4-ylidene)methyl]-2,6-diphenylthiapyrylium perchlorate and
42% 4-di-p-tolylamino-4'-[4-di-p-tolylamino)styryl]-stilbene.

Under broad-band illumination of 100 mW/cm$^2$ intensity provided by an unmodified Kodak 600H slide projector filtered through a Corning 3384 filter, the cell with Nesatron ® and indium as electrodes produced an open-circuit voltage of 400 mV, a short-circuit current of 0.75 mA/cm$^2$, and a power conversion efficiency of about 0.09%.

Comparative Example

To demonstrate the significance of the proper choice of counterelectrode, i.e., one with a proper work function, a photovoltaic cell was prepared similar to that described in Example 1, except that an evaporated gold layer was used as the counterelectrode. (Gold is considered a material with a high work function and therefore undesirable in such a use.) The cell produced an open-circuit voltage of 350 mV and a short-circuit current of 250 $\mu$A/cm.$^2$, providing a power conversion efficiency of 0.02% under the same illumination as in Example 1.

Although the invention has been described in considerable detail with particular reference to certain preferred embodiments thereof, variations and modifications can be effected within the spirit and scope of the invention.

What is claimed is:

1. A photovoltaic element, comprising:
   a layer of a photoconductive composition having opposed surfaces, said composition comprising an electrically insulating binder, a pyrylium-type dye salt and an organic photoconductor;
   and an electrical conductor adjacent each of said layer surfaces;
   said element having a conversion efficiency when exposed to sunlight of at least about 0.05 percent.

2. An element as defined in claim 1 wherein said photoconductive composition is a P-type composition, one of said conductors is a layer of a metal selected from the group consisting of indium, aluminum, magnesium, tin, chromium, copper and silver, and the other of said conductors is a semitransparent layer of indium tin oxide, tin oxide or nickel coated over a transparent support.

3. An element as defined in claim 1 wherein said composition is an N-type composition, one of said conductors is a layer of a metal selected from the group consisting of indium, aluminum, magnesium, tin, chromium, copper, and silver, and the other of said conductors is a semitransparent layer of indium tin oxide, tin oxide or nickel coated over a transparent support.

4. An element as defined in claim 1 wherein said photoconductive composition is an N-type composition and includes a dopant dispersed throughout said composition.

5. An element as defined in claim 1, and further including a nucleating layer of copper phthalocyanine between said composition and one of said conductors.

6. A photovoltaic element, comprising:
   a layer of a photoconductive composition having opposed surfaces, said composition comprising an electrically insulating binder, a pyrylium-type dye salt and an organic photoconductor;
   said dye being selected from one having the structure:

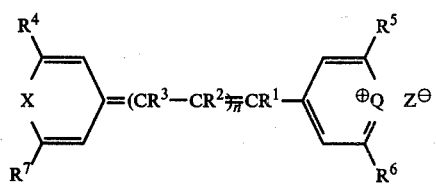

wherein:
$R^1$, $R^2$ and $R^3$ are the same or different and are each hydrogen, aryl, alkyl containing from 1 to about 6 carbon atoms, cyano or nitro;
X and Q are the same or different and are each selected from the group consisting of O, S or Se;
$n$ is 1 or 0;
$R^4$, $R^5$, $R^6$ and $R^7$ are the same or different and are each phenyl, alkyl or alkoxy containing from 1 to about 5 carbon atoms, at least two of $R^4$, $R^5$, $R^6$ and $R^7$ being phenyl; and
$Z^\theta$ is an anionic moiety;
and an electrical conductor adjacent each of said layer surfaces;
said element having a conversion efficiency when exposed to sunlight of at least about 0.05 percent.

7. A photovoltaic element, comprising:
   a layer of a photoconductive composition having opposed surfaces, said composition comprising an electrically insulating binder, a pyrylium-type dye salt and an organic photoconductor;
   said dye being selected from one having the structure:

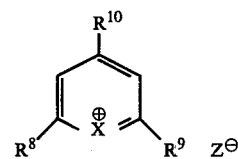

wherein:
$R^8$, $R^9$ and $R^{10}$ are each phenyl, alkyl containing from 1 to about 6 carbon atoms, or a 5- or 6-membered heterocyclic ring; with the proviso that at least one of $R^8$, $R^9$ and $R^{10}$ is an alkylamino-substituted phenyl or an alkylamino-substituted 5- or 6-membered heterocyclic ring containing from 1 to about 6 carbon atoms in the alkyl moiety;
X is oxygen, selenium or sulfur; and
$Z^\theta$ is an anionic moiety;
and an electrical conductor adjacent each of said layer surfaces;
said element having a conversion efficiency when exposed to sunlight of at least about 0.05 percent.

8. A photovoltaic cell of enhanced conversion efficiency comprising:

a layer of an aggregate photoconductive composition having opposed surfaces, said composition comprising a binder having an alkylidenediarylene moiety in a recurring unit thereof, a thiapyrylium dye salt, and an organic photoconductor, said composition being a multiphase organic solid having a continuous phase including said binder and said photoconductor and a discontinuous phase including said dye and said binder, said layer having a thickness between its opposed surfaces that is no greater than about 0.5 micron;

and an electrical conductor adjacent each of said layer surfaces;

said element having a conversion efficiency when exposed to sunlight of at least about 0.05 percent.

9. A cell as defined in claim 8 wherein one of said conductors comprises a transparent layer of indium tin oxide, tin oxide or nickel coated over a transparent support; and the other conductor comprises a layer of indium.

10. A photovoltaic element, comprising:

a layer of a photoconductive composition having opposed surfaces, said composition comprising an electrically insulating binder, a pyrylium-type dye salt and an organic photoconductor;

said dye being selected from one having the structure:

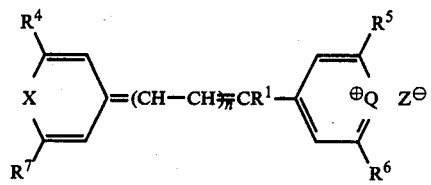

wherein:

$R^1$ is hydrogen, aryl, alkyl containing from 1 to about 6 carbon atoms, cyano or nitro;

X and Q are either S, O; S, S; Se, O; or S, Se respectively, $n$ is 1 or 0;

$R^4$, $R^5$, $R^6$ and $R^7$ are the same or different and are each phenyl, alkyl or alkoxy containing from 1 to about 5 carbon atoms, at least two of $R^4$, $R^5$, $R^6$ and $R^7$ being phenyl; and $Z^\ominus$ is an anionic moiety;

and an electrical conductor adjacent each of said layer surfaces;

said element having a conversion efficiency when exposed to sunlight of at least about 0.05 percent.

11. A photovoltaic cell of enhanced conversion efficiency, comprising:

a layer of a photoconductive composition having opposed surfaces, said composition comprising:

an alkylidenediarylene polycarbonate binder, 4-[(2,6-diphenyl-4H-thiapyran-4-ylidene)methyl]-2,6-diphenylthiapyrylium perchlorate, and 4-di-p-tolylamino-4'-[4-(di-p-tolylamino)styrene]stilbene, said layer having a thickness between its opposed surfaces that is no greater than about 0.5 micron;

adjacent one of said layer surfaces a transparent layer of indium tin oxide, tin oxide or nickel coated over a transparent support; and adjacent the other of said layer surfaces a layer of indium.

* * * * *